(12) United States Patent
Schmidt et al.

(10) Patent No.: US 8,164,250 B2
(45) Date of Patent: Apr. 24, 2012

(54) LIGHT EMITTING DEVICE WITH IMPROVED CONVERSION LAYER

(75) Inventors: Peter Schmidt, Aachen (DE); Helmut Bechtel, Roetgen (DE); Jorg Meyer, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 1004 days.

(21) Appl. No.: 11/575,582

(22) PCT Filed: Sep. 20, 2005

(86) PCT No.: PCT/IB2005/053080
§ 371 (c)(1), (2), (4) Date: Mar. 20, 2007

(87) PCT Pub. No.: WO2006/035353
PCT Pub. Date: Apr. 6, 2006

(65) Prior Publication Data
US 2009/0184624 A1    Jul. 23, 2009

(30) Foreign Application Priority Data
Sep. 28, 2004    (EP) .................................... 04104729

(51) Int. Cl.
*H01J 1/62* (2006.01)
*H01J 63/04* (2006.01)

(52) U.S. Cl. ........................................................ 313/501
(58) Field of Classification Search .......... 313/498–512
See application file for complete search history.

(56) References Cited

U.S. PATENT DOCUMENTS

| | | | |
|---|---|---|---|
| 6,103,540 A | 8/2000 | Russell et al. | |
| 6,395,564 B1 | 5/2002 | Huang | |
| 6,703,780 B2 * | 3/2004 | Shiang et al. | 313/504 |
| 2003/0089918 A1 | 5/2003 | Hiller et al. | |
| 2004/0145308 A1 * | 7/2004 | Rossner et al. | 313/512 |
| 2005/0236971 A1 * | 10/2005 | Mueller-Mach et al. | 313/503 |
| 2005/0269582 A1 * | 12/2005 | Mueller et al. | 257/94 |

FOREIGN PATENT DOCUMENTS

| | | |
|---|---|---|
| EP | 1150361 | 10/2001 |
| EP | 1394864 | 3/2004 |
| JP | 2003204079 A | 7/2003 |

* cited by examiner

*Primary Examiner* — Toan Ton
*Assistant Examiner* — Zachary Snyder
(74) *Attorney, Agent, or Firm* — Mark L. Beloborodov; John F. Salazar

(57) ABSTRACT

A light emitting device includes a substrate layer and a light conversion layer located on said substrate layer. The light conversion layer is a polycrystalline ceramic layer, and is positioned on the substrate layer by sintering.

7 Claims, 3 Drawing Sheets

LIGHT EMITTING DEVICE WITH IMPROVED CONVERSION LAYER

This invention relates to the field of light emitting devices, especially LEDs. In today's LEDs, there is usually a substrate, on which several further layers, amongst them one or more light emitting layers are provided. After finishing of the LED, a light conversion means is located on the LED. This is done to convert some of the light, which is emitted by the light emitting layers, to a different wavelength, e.g. from blue to yellow, in order to achieve a white light for the LED. In several applications, this light emitting means is a polycrystalline ceramic material, such as polycrystalline YAG (Yttrium-Aluminum-Oxide) doped with Cerium.

However, such applications bear several drawbacks:

At first, the polycrystalline ceramic material is brought up on the LED after finishing of the layers, which is disadvantageous for some applications. Second, the polycrystalline material needs a "glue" for sticking to the LED. Third, the distribution of the polycrystalline material for some applications cannot be controlled.

It is therefore an object of the present invention to provide a light-emitting device, which comprises a light conversion means with improved properties.

Accordingly, a light-emitting device is provided comprising a substrate layer and a light conversion layer located on said substrate layer, whereby the light conversion layer is a polycrystalline ceramic layer, characterized in that the light conversion layer is positioned on the substrate layer by sintering.

The term "light conversion layer" means in particular, that the light conversion layer comprises a material that is capable of absorbing the light emitted by a light emitting layer present in the LED and emitting light of a different wavelength, e.g. absorbing blue light from the light emitting layer and emitting yellow or green light.

The term "polycrystalline ceramic layer" means in particular that the layer is made out of a material, which has a median average diameter of $\geq 1$ μm and $\leq 100$ μm, preferably of $\geq 10$ μm and $\leq 50$ μm.

"Sintering" in the sense of the present invention includes also bonding of the polycrystalline ceramic layer to the substrate layer by applying an external pressure. Such techniques are known as sinter-bonding, diffusion bonding, hot uniaxial pressing (HUP) or hot recrystallization pressing. "Sintering" in the sense of the present invention includes the bonding of monolithic ceramic layers with substrate layers as well as the bonding of powder layers of the light conversion material to the substrate in one or more processing steps.

According to a preferred embodiment of the present invention, the refractive index $n_2$ of said light conversion layer is equal or larger than the refractive index $n_1$ of the substrate layer. This bears the advantage, that light that would otherwise be lost due to total reflection at the substrate layer interface may enter the light conversion layer and thus be used.

According to a preferred embodiment of the present invention, the refractive index $n_2$ of said light conversion layer and the refractive index $n_1$ of the substrate layer match: $n_2-n_1 \geq 0$ and $n_2-n_1 \leq 1$. By doing so, a good match between the substrate layer and the light conversion layer can be achieved. Preferably, the refractive index $n_2$ of said light conversion layer and the refractive index $n_1$ of the substrate layer match: $n_2-n_1 \geq 0$ and $n_2-n_1 \leq 0,8$, more preferably $n_2-n_1 \geq 0$ and $n_2-n_1 \leq 0,4$).

According to a preferred embodiment of the present invention, the collateral edges of the light conversion layer are essentially matched to the collateral edges of the substrate layer. "Essentially" in the sense of the present invention means in particular that the edges of the substrate layer and the light conversion layer fit in an extent as usually achieved in a cut and break process of a two layer sintered ceramic.

It is especially preferred that the light conversion layer does not extend itself sideways over the substrate layer.

By doing so, better performance behaviour of the LED which contains the substrate layer and the light conversion layer can be achieved. Especially with increasing LED chip size the LED efficiency and emission uniformity increase.

According to a preferred embodiment of the present invention, the light conversion layer has a thermal stability of $\leq 1000°$ C. and $\geq 200°$ C. for a continuous heating time of $\geq 1$ h and $\leq 100$ h. This is especially preferred for applications in which the LED tends to get quite hot during a longer run-time. Preferably, the light conversion layer has a thermal stability of $\leq 1000°$ C. and $\geq 400°$ C., more preferred $\leq 1000°$ C. and $\geq 600°$ C. and most preferred $\leq 1000°$ C. and $\geq 800°$ C. for a continuous heating time of $\geq 1$ h and $\leq 100$ h.

According to a preferred embodiment of the present invention, the light conversion layer is essentially free of organic material and/or silicon material. This is especially preferred for applications, which employ a larger amount of heat to the LED. In these cases, such organic materials and/or silicon materials tend to react thermally thus showing discoloration. "Organic materials" means especially organic polymers, "silicon material" means especially silicone polymers.

According to a preferred embodiment of the present invention, the ratio of the coefficient of expansion of the substrate layer towards the coefficient of expansion of the light conversion layer is $\geq 1:2$ and $\leq 2:1$. Preferably, the ratio of the coefficient of expansion of the substrate layer towards the coefficient of expansion of the light conversion layer is $\geq 1:1.5$ and $\leq 1.5:1$, more preferred $\geq 1:1.25$ and $\leq 1.25:1$. By doing so, an essentially tension-free LED can be built. A preferred material for the substrate layer and light conversion layer in this regard is $Al_2O_3$ (sapphire) and YAG($Y_3Al_5O_{12}$) respectively. The coefficient of thermal expansion for sapphire is $8,6 \times 10^{-6}$/K and for YAG $6,9 \times 10^{-6}$/K. Thus the ratio of the coefficient of expansion of the substrate layer towards the coefficient of expansion of the light conversion layer is $1,24:1$, which is most preferred for the present invention.

According to a preferred embodiment of the present invention, the color temperature of the light-emitting device has been adjusted by abrasion of the light conversion layer. In case the chromaticity of a LED is not exactly equal to a chromaticity of a blackbody radiator, the color temperature with the nearest chromaticity match is chosen (also called Correlated Color Temperature).

This is one of the major advantages and preferred features of the present invention. It has been a predominant issue in the production of LEDs that the color temperature of LEDs varies from one LED to another without the ability of changing the color temperature after fabrication of the LED. This problem appears especially in LEDs which use blue light emitting materials and YAG:Ce as conversion materials. Since the Absorption of the YAG:Ce material is rather narrow, only slight changes in the absorption bands and intensities of the blue light emitting material will lead to dramatic changes in the color temperature.

In a preferred embodiment of the present invention, the color temperature of the LED is therefore changed after fabrication of the LED by abrasion of the light-emitting layer. Since the light-emitting layer is sintered, this abrasion can be achieved very easily, exactly and effectively. It is in this context especially preferred that the abrasion is done by a laser process, although all other known abrasion processes used in the field may be employed as well.

According to a preferred embodiment of the present invention, the light emitting device furthermore comprises a further light conversion means, whereby the further light conversion means emits light in a wavelength different from the light conversion layer. By doing so, a further emission band may be introduced in the LED. This embodiment is especially of use in cases when the emitting material emits blue light and the light conversion layer emits green or yellow light. In these cases, a further light conversion means, which emits red light may be introduced, thereby further improving the emitting behavior of the LED. This additional light conversion means may be provided on the LED by all known techniques in the field. Of practical use are polycrystalline powders of oxides, nitrides and mixtures thereof doped with $Eu^{2+}$ or $Eu^{3+}$ ions. Additional ions for alteration of the absorption and/or emission properties may also be added.

According to a preferred embodiment of the present invention, the substrate layer is made of a material chosen from a group comprising sapphire ($Al_2O_3$), zinc oxide (ZnO), $Mg_{1-x}Zn_xAl_2O_4$ with x being $0 \geq x \leq 1$ and mixtures thereof and/or the light conversion layer is made of a material chosen from the group of garnet type materials $A_3B_5O_{12}$ (A=Y, Lu, Gd, La, Tb, Ba, Sr, Ca or mixtures thereof; B=Al, Ga, Si, Sc, Mg or mixtures thereof), whereby the light conversion layer may optionally comprise doping materials facilitating the light absorption and emission processes. Preferred doping materials are chosen from a group comprising Cerium, Pr, Eu, Sm, Nd, Tb, Ho, Er, Tm, Yb, Dy and mixtures thereof The preferred doping levels are $\leq 10$ mol-% and $\geq 0.01$ mol-%, more preferred $\leq 5$ mol-% and $\geq 0.025$ mol-% and most preferred $\leq 3$ mol-% and $\geq 0.05$ mol-%.

Preferably the additional light conversion means—if an additional light conversion means is used—comprises a material selected out of the group comprising AES:Eu (AE=Sr, Ca, Mg, Ba or mixtures thereof), $AE_2Si_{5-x}Al_xN_{8-x}O_x$:Eu (AE=Sr, Ba, Ca or mixtures thereof) and mixtures thereof. The preferred doping levels are $\leq 10$ mol-% and $\geq 0.01$ mol-%, more preferred $\leq 5$ mol-% and $\geq 0.025$ mol-% and most preferred $\leq 3$ mol-% and $\geq 0.05$ mol-%.

According to a preferred embodiment of the present invention, the thickness of the light conversion layer is $\geq 20/[D \%]$ nm and $\leq 60/[D \%]$ nm, whereby D % means the molar ratio of the doping material. It has been shown in practice, that this thickness is most suitable for the conversion and thus for the obtainment of a desired color temperature.

A light emitting device according to the present invention may be of use in a broad variety of systems and/or applications, amongst them one or more of the following:
- household application systems
- shop lighting systems,
- home lighting systems,
- accent lighting systems,
- spot lighting systems,
- theater lighting systems,
- fiber-optics application systems,
- projection systems,
- self-lit display systems,
- pixelated display systems,
- segmented display systems,
- warning sign systems,
- medical lighting application systems,
- indicator sign systems, and
- decorative lighting systems.
- portable systems
- automotive applications.

The present invention also includes a method of preparing a LED comprising the steps of:
  (a) providing a substrate layer area
  (b) sintering a light conversion layer area on one side of the substrate layer area
  (c) providing a light emitting layer area on the side of the substrate layer opposite to the side, where the light conversion layer area is located
  (d) dicing the obtained structure to obtain LEDs each comprising a substrate layer and a light conversion layer
  (e) measuring the color temperature of a LED
  (f) adjusting the color temperature of the LED by abrasion of the light conversion layer whereby the steps (e) and (f) may be repeated ad libitum and for one or more of the LEDs.

This method bears in particular the advantages as set out above, amongst them:
  LEDs, in which the collateral sides of the substrate layer and the light conversion layer are matched and
  LEDs, which color temperature has been set in an easy and effective way.

It should be noted, that it is a prominent feature of a method according to the present invention, that the light conversion layer is provided prior to the light emitting layer. This especially for the reason that by doing so, also materials can be of use for the light emitting layer, which are thermally instable during the sintering of the light conversion material.

The present invention also includes a program for executing the steps (d) and/or (e) and/or (f) of the method as described above. Among others a program is provided to apply a defined current to the LED, measuring the light emission, calculating the color temperature and controlling a machine for abrasion of the light conversion layer. Measurement of the emitted light and calculation of the color temperature can be performed integrally. In another embodiment emitted light is projected on a diffusing plate and measured with a camera (CCD) device to determine the area resolved color temperature. A connected LASER abrasion system is then controlled for position resolved abrasion of the light conversion layer to achieve a predetermined color temperature profile on the diffusion plate.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the subclaims, the figures and the following description of the respective figures and examples—which in an exemplary fashion—show several preferred embodiments of a light emitting device and a method of producing such a light emitting device according to the invention.

Figure 1:
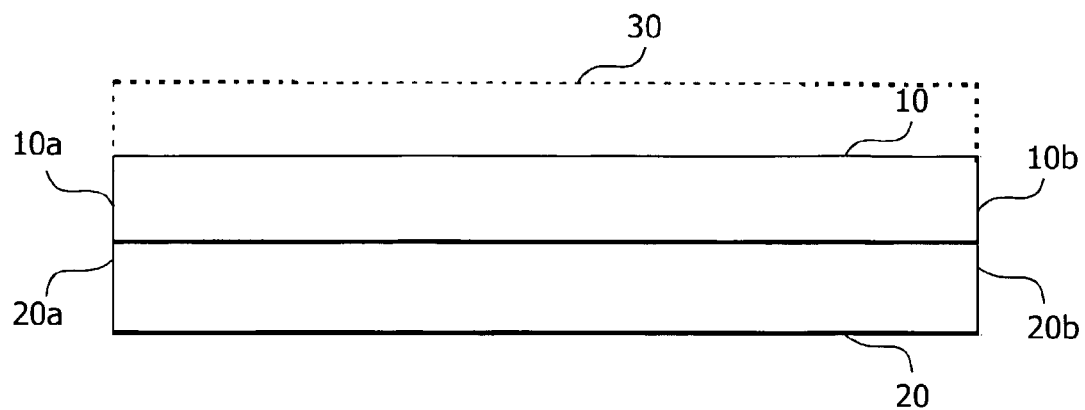
FIG. 1 shows a schematic cross-sectional partial view of a substrate layer and a sintered light conversion layer according to the invention

FIG. 1 shows a schematic cross-sectional partial view of a substrate layer 10 and a sintered light conversion layer 20 according to the invention. As can be seen from this schematic view, the collateral edges 10a, 10b of the substrate layer and the collateral edges 20a, 20b of the light conversion layer are matched towards each other, so that the light conversion layer 20 does not exceed sideward above the substrate layer 10. The dotted lines in FIG. 1 show, where further layers or parts (30) of the LED are preferably provided, such as a light-emitting layer.

Figure 2:
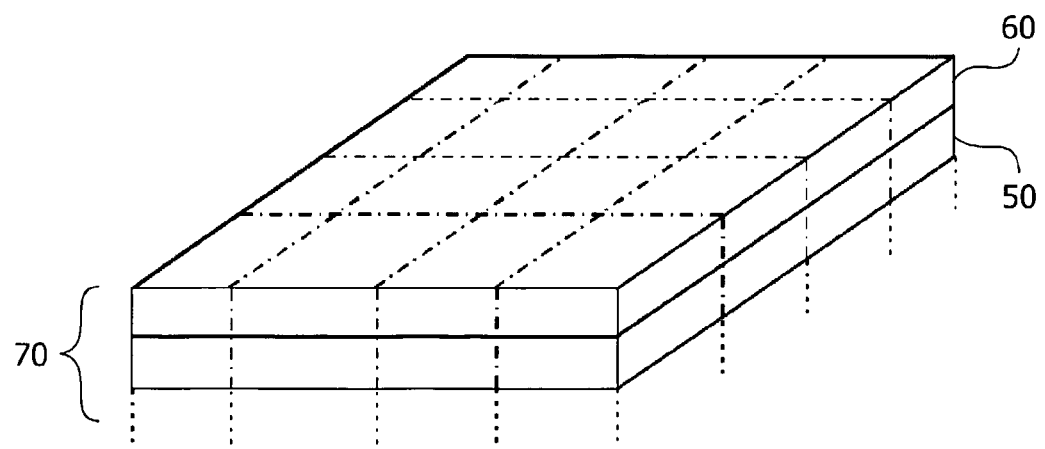
FIG. 2 shows a schematic perspective view employing the method of producing the LEDs according to the invention prior to step (d)

FIG. 2 shows a schematic perspective view employing the method of producing the LEDs according to the invention prior to step (d). As can be seen, there is a substrate layer area 50 provided, on which a light conversion layer area 60 has been located. Further parts of layers of the LED are usually also present on the side of the substrate layer area 50 which is opposite to the side, where the light conversion layer area 60 has been provided (indicated by the dotted lines). Altogether, a structure 70 is formed. When the LED is finished, the structure 70 is cut into pieces as indicated by the dot-and-line formed lines. By doing so, LEDs can be obtained, in which the collateral side walls of the substrate layer and light conversion layer are matched and the light conversion layer does not exceed sideways over the substrate layer.

In FIG. 2, the LEDs, which are produced by cutting or slicing of the structure 70 are—when seen in top view—somewhat rectangular in shape. However, it goes without saying, that by the method as presented by the present invention, LEDs of any shape may be produced.

Figure 3:
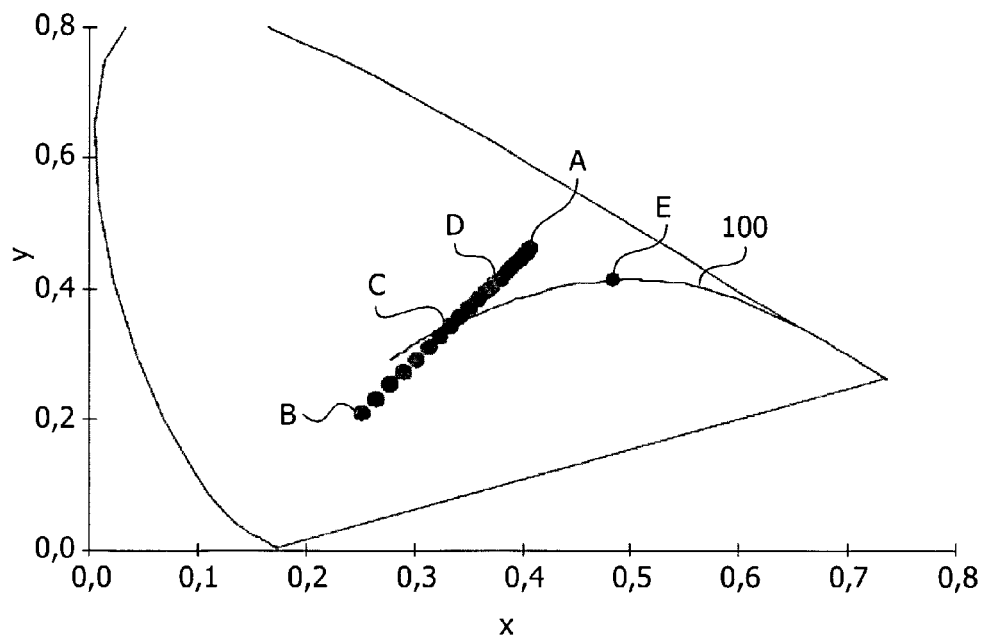
FIG. 3 is a graph, in which the change of the color properties of a LED according to the invention by abrasion is shown
Figure 4:
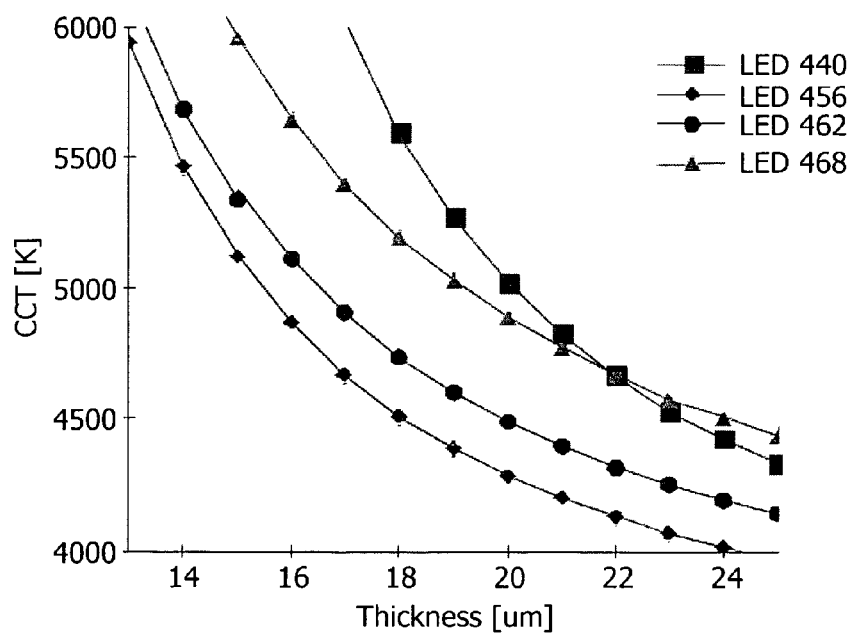
FIG. 4 is a graph employing the connection between the color temperature and the thickness of the light conversion layer for a series of four exemplarily LEDs

FIG. 3 is a graph, in which the change of the color properties of a LED according to the invention by abrasion is shown. FIG. 4 is a graph employing the connection between the color temperature and the thickness of the light conversion layer for a series of four exemplarily LEDs. After the manufacture of the LEDs, the LEDs will in most cases have different color temperatures. By employing the present invention it is possible to adjust this color temperature by abrasion of the light conversion layer.

In an example, an LED might have the color temperature as represented by color point A in FIG. 3. By abrasion of the light conversion layer, it is possible to shift the color temperature and properties as indicated by the dots towards color point B. However, it is for most applications desired to reach the line 100 (the so-called Black Body line). In this case, the abrasion will only be done until color point C is reached, which is on the Black Body-line.

However, it should be noted, that for some applications it might be useful to adjust the color properties to a different color point, e.g. color point D. This is useful for cases in which an additional light conversion means, e.g. a red light emitting light conversion means is used. When the light conversion means is also applied on the LED, the color properties will be shifted to color point E, which is on the Black Body line.

In these cases the following procedure has shown to be most effective:
Production of the LED
Adjusting the color temperature to a desired point, e.g. point D
Providing the light conversion means, e.g. by covering the LED with a polycrystalline powder,
thus obtaining a shift of the color properties of the LED to color point E, which is on the Black Body line It goes without saying that this procedure is of best use, when the light conversion means, in this case a red light conversion means, is less sensitive to shifts in the emitting spectra of the LED than the light conversion layer, since it is in most cases not possible to adjust the light conversion means after application. However, for light conversion means, which emit red light, this is usually the case and the color point D, which needs to be adjusted can easily be calculated and so the endpoint E can be reached with a good accuracy.

As can be seen from FIG. 4, the thickness of the light conversion layer dramatically affects the color temperature of the LED. In FIG. 4, four exemplary LEDs were analyzed with emitting material, which emits light in the wavelengths of 440 nm, 456 nm, 462 nm and 468 nm, respectively. The LEDs each had a light conversion layer comprising YAG:Ce with a doping level of 2 molar-%. FIG. 4 shows, that simply by reducing the thickness of the light conversion layer by abrasion, a broad range of color temperatures can be reached quite easily.

By choosing the optimum thickness for the light conversion layer, the doping level of the doping material needs to be taken into account. It has been shown, that the thickness of the light conversion layer is $\geq 20/[D\%]$ nm and $\leq 60/[D\%]$ nm, whereby D % means the molar ratio of the doping material. For the exemplarily LEDs shown in FIG. 4, the optimum thickness of the light conversion layer is therefore $\geq 10$ nm and $\leq 30$ nm for 2 mol-% doping with Ce.

The process of sintering according to the invention is—in a merely exemplarily fashion—furthermore illustrated by the following examples:

EXAMPLE 1 a) Manufacturing of a $Y_3Al_5O_{12}$:Ce (YAG:Ce) Polycrystalline Ceramic 40 g $Y_2O_3$, 32 g $Al_2O_3$ and 3.44 g $CeO_2$ are mixed with 1.5 kg $Al_2O_3$ milling balls (>99.9 wt % purity, 2 mm diameter) and ball milled with isopropanol for 12 hrs. The milled slurry is dried using a spray dryer. The granulated powder is then calcined in alumina boats at 1300° C. for 2 hrs under a carbon monoxide atmosphere.

The obtained YAG:Ce powder is des-agglomerated with a planet ball mill (agate balls, under ethanol) and then the slurry is slip-cast in a plaster mold. After controlled drying the green bodies (100 mm diameter, 2 mm thickness) are sintered at 1700° C. for 2 hrs on graphite plates under a carbon monoxide atmosphere.

One surface of the YAG:Ce ceramic is then finished by polishing. The density of the obtained YAG:Ce ceramic is >98% of the theoretical density.

b) Diffusion Bonding of the YAG:Ce Ceramic and a Sapphire Waver

A sapphire—YAG:Ce composite is diffusion bonded by means of hot uniaxial pressing (HUP). For this purpose a sapphire waver and the polished YAG:Ce ceramic were positioned between tungsten sheets (0.5 mm thickness) and put into a graphite die. To increase the production rate several tungsten/sapphire/YAG stacks can be stacked one above each other.

After evacuation of the HUP apparatus it is first heated up to 1700° C. within 4 hrs without applying an external pressure. Then the pressure is increased to 5000 PSI and kept constant for 2 hours. Then the system is cooled down to 1300° C. within 2 hours under constant pressure followed by cooling to room temperature within 6 hours.

c) Post Annealing of the Sapphire/YAG:Ce Composites

After polishing of the YAG:Ce surface sapphire/YAG:Ce composite is annealed at 1250° C. in air for 2 hours (heating and cooling ramps: 100 K/hr).

EXAMPLE 2

GaN MQW light emitting layers were deposited on the sapphire surface of a 2" sapphire/YAG:Ce substrate/light conversion waver as described in Example 1. With electrical probe contacts individual LEDs on the substrate were operated consecutively at 40 mA current. Spectral emission was recorded, while an excimer LASER was used to abrase the YAG:Ce light conversion layer in the area of the emitting LED until a CIE 1931 color point was obtained sitting on a line given by: y=(0.415-0.303)/(9.485-9.697)*(x-0.485)+0.415. (This line is defined by the CIE 1931 chromaticity of the red emitting CaS:Eu phosphor and a selected white point close to the Black Body line at x=0.485, y=0.415 for a color temperature of 2400 K.) Then the substrate with the light emitting layer and the adjusted light conversion layer was diced and individual LEDs were packaged into a reflecting cup and connected to external electrical contact pads. Then a slurry of 1 percent by weight of poly-vinyl-alcohol (PVA) and 0.01 percent by weight of ammonium dichromate (ADC) in water with 10 percent by weight of CaS:Eu phosphor was dispersed on the die. After drying and exposure to UV light a robust phosphor layer was formed.

Figure 5:
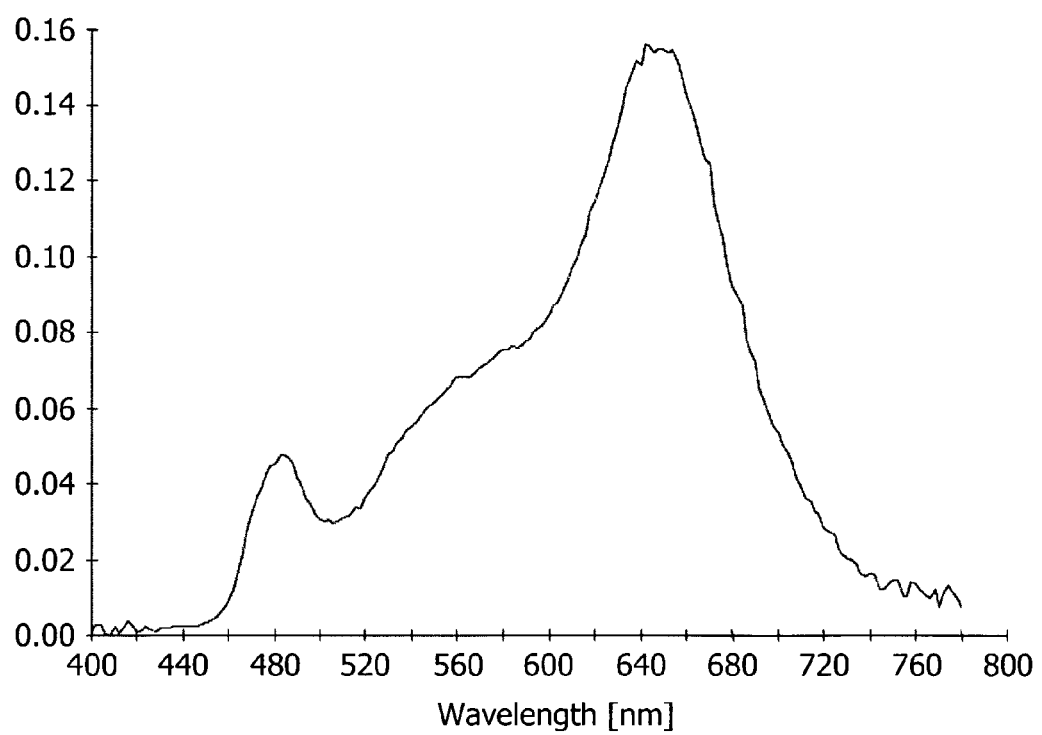
FIG. 5 is a graph showing the emission spectrum of a LED according to Example 2.

FIG. 5 shows the emission spectra of one LED according to Example 2. It can be seen that a white LED with a low color temperature and a good color rendering can be achieved.

The invention claimed is:

1. A light emitting device comprising:
a substrate layer of $Al_2O_3$; and
a first light conversion layer located on said substrate layer and having a doping material,
said substrate layer being of a different material as compared to said first light conversion layer:
wherein said first light conversion layer is doped at doping levels of $\leq 3$ mol-% and $\geq 0.05$ mol-%:
and wherein said first light conversion layer has a thickness of $\geq 10$ nm and $\leq 30$ nm;
wherein said first light conversion layer and said substrate layer have collateral edges which are matched;
wherein the first light conversion layer comprises a polycrystalline ceramic layer of YAG doped with Ce,
wherein a refractive index $n_2$ of said first light conversion layer is equal or larger than a refractive index $n_1$ of said substrate layer and wherein $n_2-n_1 \geq 0$ and $n_2-n_1 \leq 1$
wherein the light conversion layer is positioned on the substrate layer by sintering,
and wherein a color temperature of the LED is adjustable by abrasion of the light conversion layer.

2. The light emitting device according to claim 1, further comprising a second light conversion layer affixed to said first light conversion layer, said second light conversion layer selected out of the group of AES:Eu wherein AE is selected from the group Sr, Ca, Mg, Ba and mixtures thereof, $AE_2Si_{5-x}Al_xN_{8-x}O_x$:Eu wherein AE is selected from the group of Sr, Ba, Ca and mixtures thereof, and mixtures thereof.

3. The light emitting device according to claim 1, wherein the first light conversion layer has a thermal stability of $\leq 1000°$ C. and $\geq 200°$ C. for a continuous heating time of $\geq 1$ h and $\leq 100$ h.

4. The light emitting device according to claim 1, wherein the light conversion layer is essentially free of organic material and/or silicon material.

5. The light emitting device according to claim 2, wherein said second light conversion layer emits light in a wavelength different from the first light conversion layer.

6. The light emitting device according to claim 1, wherein the substrate layer is made of a material chosen from a group comprising sapphire ($Al_2O_3$), zinc oxide (ZnO), $Mg_{1-x}Zn_xAl_2O_4$ with x being $0 \geq x \leq 1$ and mixtures thereof; and/or the light conversion layer is made of a material chosen from a group comprising garnet type materials $A_3B_5O_{12}$, where A=Y, Lu, Gd, La, Tb, Ba, Sr, Ca or mixtures thereof, and B = Al, Ga, Si, Sc, Mg or mixtures thereof; wherein the light conversion layer comprises a doping material facilitating light absorption and emission processes, the doping material being chosen from a group comprising Cerium, Pr, Eu, Sm, Nd, Tb, Ho, Er, Tm, Yb, Dy and mixtures thereof.

7. The light emitting device according to claim 1, wherein a thickness of the first light conversion layer is $\geq 20/[D\%]$ nm and $\leq 60/[D\%]$ nm, where D % is a molar ratio of the doping material.

* * * * *

UNITED STATES PATENT AND TRADEMARK OFFICE
CERTIFICATE OF CORRECTION

PATENT NO. : 8,164,250 B2
APPLICATION NO. : 11/575582
DATED : March 20, 2007
INVENTOR(S) : Peter Schmidt et al.

Page 1 of 1

It is certified that error appears in the above-identified patent and that said Letters Patent is hereby corrected as shown below:

In the Specification

Column 6
Line 22, replace "$\geq$ 20/[D%] nm and $\leq$60/[D%] nm" with --$\geq$ 20/[D%] μm and $\leq$60/[D%] μm--;
Lines 25 and 26, replace "$\geq$ 10 nm and $\leq$ 30 nm" with --$\geq$ 10 μm and $\leq$ 30 μm--;

In the Claims

Claim 1
Col 7, Line 42, replace "$\geq$ 10 nm and $\leq$ 30 nm" with --$\geq$ 10 μm and $\leq$ 30 μm--;

Claim 7
Col 8, Lines 40 & 41, replace "$\geq$ 20/[D%]nm and $\leq$60/[D%]nm" with --$\geq$ 20/[D%]μm and $\leq$60/[D%]μm--.

Signed and Sealed this
First Day of September, 2015

Michelle K. Lee
*Director of the United States Patent and Trademark Office*